US011756732B2

(12) United States Patent
Valat et al.

(10) Patent No.: US 11,756,732 B2
(45) Date of Patent: Sep. 12, 2023

(54) METHOD FOR ASSEMBLING A METAL PART AND A CERAMIC PART, AND ELECTRICAL DEVICE, IN PARTICULAR A CAPACITIVE SENSOR, PRODUCED BY SAID METHOD

(71) Applicant: FOGALE SENSORS, Nîmes (FR)

(72) Inventors: Mathieu Valat, Saint-Genies-de-Malgoires (FR); Jean-Pierre Ruffini, Bouillargues (FR)

(73) Assignee: FOGALE SENSORS, Nîmes (FR)

( * ) Notice: Subject to any disclaimer, the term of this patent is extended or adjusted under 35 U.S.C. 154(b) by 291 days.

(21) Appl. No.: 17/275,815

(22) PCT Filed: Sep. 13, 2019

(86) PCT No.: PCT/EP2019/074540
§ 371 (c)(1),
(2) Date: Mar. 12, 2021

(87) PCT Pub. No.: WO2020/053415
PCT Pub. Date: Mar. 19, 2020

(65) Prior Publication Data
US 2022/0051848 A1 Feb. 17, 2022

(30) Foreign Application Priority Data
Sep. 14, 2018 (FR) ...................... 1858289

(51) Int. Cl.
*H01G 4/008* (2006.01)
*B22F 3/15* (2006.01)
*B22F 7/06* (2006.01)

(52) U.S. Cl.
CPC ............. *H01G 4/008* (2013.01); *B22F 3/15* (2013.01); *B22F 7/06* (2013.01); *B22F 2301/25* (2013.01); *B22F 2302/253* (2013.01)

(58) Field of Classification Search
CPC .......... B22F 3/15; B22F 7/06; B22F 2301/25; B22F 2302/253; H01G 4/008; C04B 37/005
See application file for complete search history.

(56) References Cited

U.S. PATENT DOCUMENTS

| 3,489,627 A | 1/1970 | Botden et al. |
| 4,296,148 A | 10/1981 | Friese |
| 2002/0084885 A1 | 7/2002 | Wienand et al. |

FOREIGN PATENT DOCUMENTS

| EP | 0595075 A2 | 5/1994 |
| WO | 2010055264 A1 | 5/2010 |
| WO | WO-2022017850 A1 * | 1/2022 |

OTHER PUBLICATIONS

International Search Report and Written Opinion received for PCT/EP2019/074540, dated Oct. 8, 2019.
(Continued)

*Primary Examiner* — Nathan Milakovich
(74) *Attorney, Agent, or Firm* — Greer, Burns & Crain, Ltd

(57) ABSTRACT

A method for the assembly of a metal part and a ceramic part, including the following steps:
  supplying a solid ceramic part of the alumina type;
  supplying a solid metal part, the metal being selected from platinum and tantalum, or an alloy including a majority of one of these metals;
  depositing at least one layer, called interface layer, on at least one of the solid parts, the interface layer containing magnesium oxide;
  bringing into contact the solid metal part and the solid ceramic part such that the interface layer is located between the solid parts; and
  hot densification under pressure of the solid parts brought into contact, to create a close bond between the solid
(Continued)

parts and form a spinel from the interface layer. An electrical device, such as a capacitive sensor having a sensitive part produced according to the present method, is also provided.

18 Claims, 1 Drawing Sheet

(56) References Cited

OTHER PUBLICATIONS

French Search Report and Opinion received for Application No. 1858289 dated May 20, 2019.

\* cited by examiner

METHOD FOR ASSEMBLING A METAL
PART AND A CERAMIC PART, AND
ELECTRICAL DEVICE, IN PARTICULAR A
CAPACITIVE SENSOR, PRODUCED BY SAID
METHOD

BACKGROUND

The present invention relates to a method for the assembly of a metal part and a ceramic part, in particular of alumina. It also relates to an electrical device, and in particular a capacitive sensor the sensitive part of which is assembled according to this method.

The field of the invention is non-limitatively that of the field of bonding methods for high-temperature applications.

A capacitive sensor can be used for determining a distance or a variation in distances by using capacitance measurements. It comprises a body and an electrode electrically insulated from the body by a dielectric or ceramic element. The conductive object the distance or the distance variation of which is to be determined and the electrode form a capacitor, the capacitance of which is measured. The distance or the distance variation is deduced from this capacitance measurement.

Such sensors can, for example, be intended to be utilized to carry out measurements or controls in reactors or turbine engines. In fact, the capacitive sensors can be utilized in particularly demanding environments, with high temperature and pressure conditions (for example, over 800° C. or 1000° C. with several tens of bars), with considerable mechanical vibrations and in the presence of corrosive gases.

The high temperatures have a direct influence on the mechanical and electrical properties of the materials of the sensor and on the interfaces thereof, in particular:
  The differences of the thermal expansion and/or elasticity coefficients generate mechanical stresses in the materials which can degrade the performance of the sensors, the reliability and lifetime thereof.
  The electrical properties of the materials, such as for example the dielectric permittivity, may be modified and degraded.

It is therefore necessary to identify conductive and insulating materials having electrical, mechanical and physicochemical properties compatible with the conditions of use imposed.

The technology to be utilized for the assembly of a capacitive sensor must make it possible to create durable and high-quality interfaces between the assembled materials. Thus, it is necessary for the assembled materials to be compatible in terms of the thermal expansion and ductility coefficients.

By way of example, alumina, i.e. aluminium oxide, for the insulating material, and platinum as conductive material, have the advantages of possessing compatible ductilities and thermal expansion coefficients for temperatures even above 1500° C.

Platinum has a melting point of 1768° C., which makes it a material suitable for the demands of the applications in question. Platinum also has a high resistance to corrosion and to oxidation.

Alumina is an insulating material that maintains dielectric characteristics over a wide temperature range. However, preservation of the characteristics of alumina depends on the purity thereof, and the efforts to maintain the dielectric characteristic generally result in a drop in the adhesion properties at the interface of the materials to be assembled.

A known assembly technique is brazing.

However, in order to maintain a high dielectric permittivity of the alumina at high temperature, an increasingly well-developed composition is required. In fact, heat has a tendency to increase the diffusion of the foreign species capable of influencing the dielectric behaviour of the material. This makes producing durable, high-quality mechanical bonds difficult.

In addition, the method per se does not allow control of the uniformity of the contact along the interface between insulator and conductor. As a result, there is a reduction in the electrical properties of the assembled structure. The presence of void zones between the different materials may render the assembly mechanically fragile and sensitive to vibrations.

Finally, another significant limitation of the brazing method is the melting point of the brazing filler material, which is necessarily lower than the melting point of the materials to be assembled.

SUMMARY

A purpose of the present invention is to overcome these drawbacks.

A purpose of the present invention is to propose a method compatible with the assembly of ceramic and metal parts, the assembly being capable of use under demanding temperature and pressure conditions.

A further purpose of the present invention is to propose a method for the assembly of ceramic and metal parts, the assembly being capable of use under demanding temperature and pressure conditions, for producing an electrical sensor such as a capacitive sensor.

Another purpose of the present invention is to propose an assembly method making it possible to decouple the overall purity level of the ceramic from the quality of adhesion with the metal.

Yet another purpose of the present invention is to propose a monolithic capacitive sensor, having a continuous mechanical contact or chemical bond that is permanent and uniform over the entire length of the interfaces between the dielectric ceramic element and the electrode thereof, independently of the geometrical complexity of the interface between these elements.

Thus, one of the objects of the invention is to make it possible to obtain simultaneously a total adhesion between the ceramic and the metal, while being able to maintain, or even improve, the respective intrinsic properties thereof, in particular the dielectric properties of the ceramic insulator.

At least one of these purposes is achieved with a method for the assembly of a metal part and a ceramic part, the method comprising the following steps:
  supplying a solid ceramic part of the alumina type;
  supplying a solid metal part, the metal being selected from platinum and tantalum, or an alloy comprising a majority of one of these metals;
  depositing at least one layer, called interface layer, on at least one of the solid parts, the interface layer containing magnesium oxide;
  placing the solid metal part and the solid ceramic part in contact such that the interface layer is located between the solid parts; and
  hot densification under pressure of the solid parts brought into contact, in order to create a close bond between the solid parts and form a spinel from the interface layer.

The method according to the invention can in particular comprise supplying a solid part of an alloy comprising a majority of platinum, and one of the following components: rhodium (Rh), iridium (Ir), aluminium (Al), gold (Au).

The method according to the invention is in particular intended to produce assemblies suitable for use for example as sensors or electrical or capacitive sensor elements, at temperatures over 800° C., or even over 1000° C. or 1500° C. It is particularly suitable for the production of such sensors.

The method according to the invention makes it possible both to obtain a total adhesion between the materials of different natures of the solid parts, and to maintain, or even improve, the intrinsic properties of the materials once the close bond is produced.

Indeed, the synthesis or supply of the base materials, the ceramic of the alumina type and the metal, is decoupled from the technique for adhesion between these materials. It is thus in particular possible to use alumina of very high purity, which guarantees dielectric properties that are intact even at very high temperature.

Thus, the method according to the invention may comprise a step of supplying a solid ceramic part of the alumina type with a purity over 99.5%, or even with a purity over 99.8%.

Thanks to the presence of the interface layer, compounds favourable to the mechanical coherence of the base materials are formed during the hot densification step under pressure. This is a sort of network of chemical cohesion by the superposition of compounds promoting the mechanical stability of the two base materials.

During the step of hot densification under pressure, one the one hand, the pressure and the temperature applied cause a plastic deformation of the surfaces of the solid parts brought into contact and a diffusion of ions, which creates the close bond between the metal and the ceramic of the alumina type.

On the other hand, a spinel is formed from the interface layer of magnesium oxide MgO and alumina $Al_2O_3$ which is located in immediate proximity to the interface layer. The spinel is of magnesium oxide and aluminium, having the chemical formula $MgAl_2O_4$. The spinel is formed when the magnesium ion present in the interface layer diffuses in the alumina volume during the hot densification under pressure. The adhesion quality between the metal part and the alumina part depends significantly on the stoichiometry of the magnesium ions in the alumina. It is essential that the alumina has a high purity in order to maintain its dielectric properties at high temperature.

The method according to the invention thus makes it possible to maintain a high purity of the alumina in the mass and to localize the compounds necessary for the adhesion thereof with the metal, i.e. the magnesium oxide, only in areas where they are effectively useful. Due to the interface layer, there is no need to dope one of these materials overall.

Thus the properties, and in particular the dielectric properties, of the alumina during severe temperature increases are improved. The purity of the alumina maintained even at very high temperatures, exceeding 1500° C., guarantees the maintenance of the electrical insulation characteristics of the alumina.

Once the solid parts are assembled according to the method of the invention, they form an indissociable block, called a monolith.

According to an advantageous characteristic of the invention, the metals and metal alloys are chosen for a ductility and thermal expansion coefficient compatible with the ductility and the thermal expansion coefficient of the dielectric insulator of the alumina type. The metals and metal alloys also resist very high temperatures and corrosion.

According to a particularly advantageous, non-limitative example, the platinum/alumina pair is utilized to realize the method according to the invention. These materials are in particular compatible at the level of the thermal expansion coefficients thereof, and their assembly has a temperature stability over 1500° C.

Advantageously, the method according to the invention also makes it possible to reduce the influence of the quantity or the roughness of the surfaces in contact on the quality of adhesion between these surfaces. The interface layer makes it possible in particular to control the thickness and the uniformity of the bonding species between the alumina and the metal.

In the present application, the term "solid part" denotes a part of any shape made from solid material. The solid material can exist in different forms, and in particular in the form of a monolithic part or agglomerated powder(s).

It should be remembered that in general, a material having a high purity means that there is no, or only traces of, substances or chemical compounds foreign to the material therein. In the present case, preferably, less than 0.5%, or even less than 0.2% foreign substances are permitted in the alumina utilized in the method according to the invention.

According to an embodiment, the method may further comprise the following steps:
  encapsulating the metal and ceramic (or alumina) parts brought into contact before the step of hot densification under pressure; and
  removing the capsule after the step of hot densification under pressure.

Due to the encapsulation, the materials of the solid parts are maintained in a predefined position during the step of hot densification under pressure.

According to an advantageous embodiment of the invention, each of the types of supplying a solid part may comprise one of the following steps:
  preforming powder by cold pressing to form a solid part; or
  machining of a solid part.

According to an embodiment, the powder preforming step may be followed by a sintering step.

Thanks to the step of preforming by cold pressing, alumina and/or metal powders can be used to form the solid parts. This allows for a greater flexibility in the choice of the base materials. It is in particular possible to use alumina powders or alumina parts that are already sintered, or to use metal powders or metal parts that are already machined or sintered.

The machining of a solid part can include, for example electrical discharge machining, parting-off or any other known technique for machining a solid part. The machining itself makes it possible to obtain a solid part of a specific shape according to the desired application.

The sintering makes it possible to increase the cohesion of the preformed metal and/or alumina part. The part can thus be consolidated before the steps of bringing into contact and hot densification under pressure.

According to a non-limitative example of the invention, the hot densification under pressure comprises at least one step of hot sintering under pressure chosen from the following sintering techniques:
  hot isostatic pressing;
  spark plasma sintering;
  field assisted sintering; and
  pulsed electric current sintering.

The techniques for hot sintering under pressure make it possible to overcome the limit of the melting point of the brazing filler material for an assembly by brazing. In fact, the temperature limit for the hot sintering techniques is constituted by the entry into the liquidus range or the sublimation of one of the materials of one of the parts in the presence of the compounds of the interface or of the material of the other part. The melting point of the brazing filler material is necessarily lower than the melting point of the constitutive base materials of the assembly.

Among the sintering methods is the hot isostatic pressing (HIP) technique. In general, it is a method for producing technical parts. It allows the partial or total densification of the materials utilized by the combined application of heat and isostatic pressure. The combined application of a high temperature and pressure makes it possible to accelerate the diffusion of the materials in comparison with conventional sintering. The result obtained makes it possible to improve the properties of the material beyond its intrinsic mechanical characteristics since they are approaching the forged state. It is possible to manufacture parts having complex shapes, as a one-off or in series.

The use of the HIP method also promotes the diffusion of the free magnesium ions in the alumina and thus the creation of the spinel of $MgAl_2O_4$.

Spark plasma sintering (SPS), field assisted sintering (FAST) or pulsed electric current sintering (PECS) techniques are also methods for powder sintering by hot densification under pressure applicable in the context of the invention. In comparison with the above-mentioned HIP, these techniques are quicker but do not apply pressure isostatically.

According to an advantageous embodiment of the invention, the step of depositing at least one interface layer may be carried out by the deposition of magnesium oxide powder.

Indeed, advantageously, the magnesium oxide can be mechanically deposited by scattering on a surface of one of the solid parts. In order to improve the implantation of the powder at the surface, it can be deposited for example by grit-blasting.

Alternatively or in addition, the step of depositing at least one interface layer may be carried out by the deposition of a thin layer of magnesium and the oxidation of said thin layer of magnesium.

The deposition of the thin layer of magnesium and the oxidation of this layer are preferably carried out in a controlled environment in order to guarantee a homogeneous thickness and a stoichiometry of the interface obtained. This makes it possibly to obtain a homogeneous adhesion over the entire contact surface of the parts.

According to an embodiment, the thickness of the interface layer may be comprised between 1 μm and 50 μm. Preferably, the thickness of the interface layer is 20 μm, or comprised between 10 μm and 30 μm.

According to an advantageous embodiment of the invention, the interface layer may be deposited on the metal part.

Advantageously, the interface layer can comprise silicon.

On the one hand, silicon makes it possible to increase the adhesion between the spinel formed during the hot densification step and the metal. In fact, the silicon creates bonds with the metal.

On the other hand, the silicon participates in the consumption of the excess oxygen created by the reaction between the magnesium oxide and the alumina. Oxygen has less significant mobility than magnesium in alumina. Thus, by reducing the number of oxygen molecules, it is possible to avoid an electronically weak chemical bond between the magnesium oxide and the metal. The quality and the stability of the adhesion between the spinel and the metal can thus be improved.

Advantageously, the method according to the invention may comprise a step of depositing a layer of silicon on the metal part prior to the deposition of a layer containing magnesium oxide.

Silicon can be deposited in one layer on the metal. Then, magnesium oxide, for example in the form of powder, can be deposited on the silicon layer. These two layers thus form the interface layer.

According to an embodiment, the thickness of the silicon layer may be comprised between 10 nm and 500 nm. Preferably, the thickness of the silicon layer is 100 nm, or comprised between 50 nm and 200 nm.

Alternatively, the silicon may be mixed with the magnesium oxide powder to form the interface layer.

According to non-limitative examples, silicon may comprise at least one of the following materials: silicate, silicide.

According to an advantageous embodiment of the method according to the invention, the metal part may be an electrode and the alumina part may be a dielectric element, the electrode and the dielectric element forming a sensitive part of an electrical sensor, in particular capacitive, once assembled according to the steps of the method.

The method according to the invention may then comprise a step of forming a sensitive part of an electrical sensor, in particular capacitive, by assembly of the metal part forming an electrode and of the alumina part forming a dielectric element.

According to another aspect of the same invention, an electrical device is provided, comprising:
  at least one conductive metal part, the metal being selected from platinum and tantalum, or an alloy comprising a majority of one of these metals; and
  at least one ceramic dielectric element of the alumina type;
  the conductive part and the dielectric element being assembled according to the method according to the invention.

The electrical device according to the invention may in particular be, or comprise, or being included in:
  an electrical feedthrough of a partition, with at least one insulated conductive metal part constituting the electrical feedthrough, electrically insulated from the partition by the dielectric element;
  an electrical sensor, for example by inductive or capacitive contact with a least one conductive metal part constituting a measurement electrode, electrically insulated by the dielectric element.

Such an electrical device, produced with the method according to the invention, is perfectly suitable to be utilized under high temperature and pressure conditions (for example, over 800° C. or 1000° C. or 1500° C. with several tens of bars), in the presence of mechanical vibrations and corrosive gases.

The method according to the invention can thus make it possible to produce in particular capacitive or inductive sensors, intended to be utilized to carry out controls or measurements in turbines or reactors.

Thus the invention also relates to an electrical device in the form of a capacitive sensor suitable for being used at temperatures over 800° C. or 1000° C., or even over 1500° C., comprising:

a conductive metal part forming a measurement electrode; and a dielectric element surrounding said measurement electrode.

BRIEF DESCRIPTION OF THE DRAWINGS

Other advantages and characteristics will become apparent on examination of the detailed description of non-limitative examples, and the attached drawings in which.

DETAILED DESCRIPTION

Figure 1:
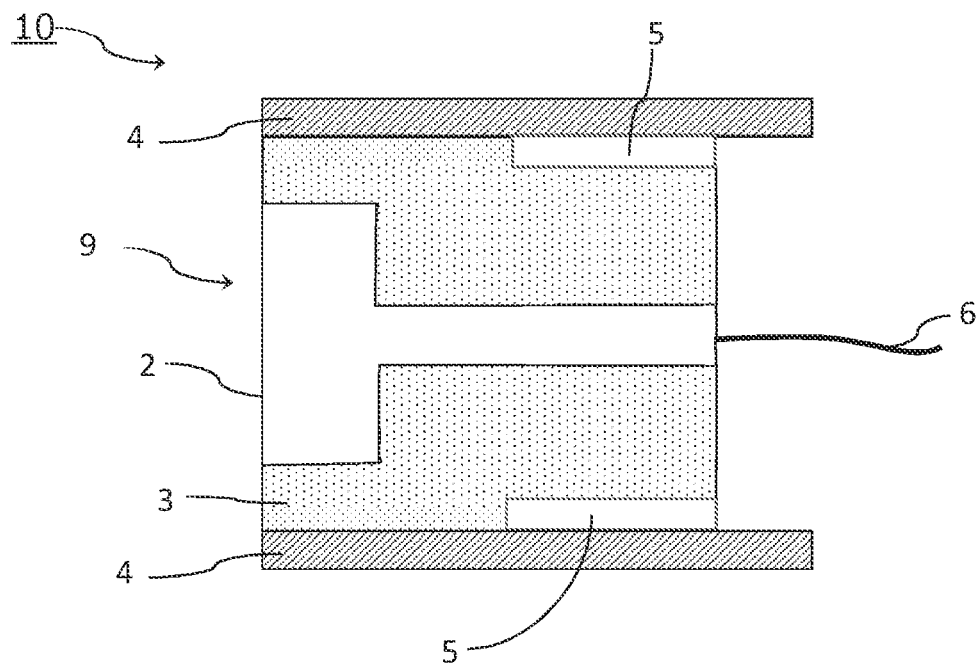
FIG. 1 is a diagrammatic representation of a non-limitative embodiment example of a capacitive sensor a part of which is produced by the method according to the present invention.

It is well understood that the embodiments that will be described hereinafter are in no way limitative. It is possible in particular to imagine variants of the invention comprising only a selection of the characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

The common elements in the Figures retain the same reference therein.

The different steps of the method for assembling a metal part and an alumina part according to embodiments of the invention will be described hereinafter.

The material for the solid metal part is chosen from the following list: platinum (Pt), tantalum (Ta), or an alloy comprising a majority of one of these materials.

The alumina itself must have a purity over 99.5%, preferably over 99.8%.

The solid parts can be obtained by preforming of powder by simple pressure or by machining, or by any other method of forming mechanical parts.

The cold preforming of powder makes it possible to obtained metal and/or alumina preforms. These preforms are also called "greens". A "green" ensures sufficient mechanical integrity of the parts for handling, making it possible to keep the powders in place until the hot densification step which will be described below. This step will completely fix the geometry of the assembled parts.

According to an embodiment example of the method according to the invention, the step of cold preforming of powders can be completed by a cold sintering step, in order to obtain parts that are mechanically more stable than with the preforming of powders alone.

Once the solid parts are obtained, a layer, called interface layer, containing magnesium oxide, is deposited on one of the two solid parts, or on both.

Magnesium oxide can be mechanically deposited by simple scattering on the surface of one of the solid parts. Magnesium oxide can also be grit-blasted in order to ensure its good implantation in the surface of the machined parts.

Alternatively, a thin layer of magnesium can also be deposited then oxidized. These steps are preferably carried out in a controlled medium in order to guarantee homogeneity both in thickness and stoichiometry of the interface layer obtained.

Magnesium oxide can be deposited in layers having thicknesses of 1 µm to 50 µm, with a preferred value of 20 µm.

According to a particularly advantageous characteristic of the invention, the interface layer can contain silicon (Si). On the side of the metal, the adhesion between the spinel formed during the hot densification under pressure (see below) and the metal can be increased due to the bonding between the silicon and the metal. Silicon also participates in the oxygen consumption which is in excess because the Mg ions migrate in the alumina. Silicon has an additional function of stabilizing the interface layer between the metal with the spinel. It participates in the consumption of the excess oxygen, which has a less significant mobility than magnesium in the alumina and makes it possible to avoid obtaining an electronically weak chemical bond between the magnesia (MgO) and the metal.

Silicon can be present in the form of silicate and/or silicide for example.

According to an example, silicon is deposited by thin layer deposition on the metal part, before the deposition of the layer containing magnesium.

According to a variant, silicon can also be one of the compounds of the powder forming the interface layer.

According to another variant, silicon can also be integrated in an alloy with the base metal of the parts used.

According to an embodiment example of the method according to the invention, silicon is deposited in a layer of approximately 100 nm in thickness on the metal, for example platinum. Then magnesium oxide is deposited in a layer of approximately 20 µm in the form of powder on the alumina. The silicon layer forms part of the interface layer.

After the deposition of the interface layer on one of the solid parts (the interface layer optionally comprising a silicon layer), the metal part and the alumina part are brought into contact so that the interface layer is located between the two solid parts.

The assembly of the two solid parts with the interface layer between them is then subjected to a step of hot densification under pressure. This step makes it possible to obtain an indissociable block constituted by a conductor and a dielectric which are permanently chemically linked. This permanent close bonding is obtained due to the micro-deformation and the diffusion of ions at the level of the interface which is formed between the alumina and the magnesium oxide of the interface layer.

The step of hot densification under pressure is carried out, preferably, by a step of hot sintering under pressure. The sintering method (or co-sintering, because it is applied to two different materials at the same time) applied to the assembly must be compatible with all the materials present in the assembly, the materials being of different natures.

Hereinafter, embodiment examples of the step of hot densification under pressure of the method according to the invention will be described.

Among the sintering methods, there is the hot isostatic pressing (HIP) technique, allowing the partial or total densification of the materials utilized by the combined application of heat and isostatic pressure. The use of the HIP method promotes the diffusion of the free magnesium ions in the alumina and thus the creation of a spinel of $MgAl_2O_4$.

Other sintering techniques are spark plasma sintering (SPS), field assisted sintering (FAST) or pulsed electric current sintering (PECS) techniques. These techniques are quick but do not apply pressure isostatically.

According to an advantageous implementation example of the method according to the invention, the metal part is made from platinum, or an alloy composed of a majority of platinum. Platinum is a noble metal which liquefies at 1768° C. It is generally recommended to densify this material at approximately 80% of its liquefaction temperature, i.e. 1414° C. This value must be adjusted to match the densification conditions of alumina, the hot densification under pressure being carried out on the assembly of the two solid parts.

The densification temperature of alumina is defined by a parametric analysis of the relationship between densification and plasticity of alumina as a function of temperature. This is necessary because the alumina passes through a vitreous (viscoplastic) transition phase at approximately 1100° C., this vitreous transition temperature depending in particular on its crystalline form and its purity. It is generally advised to sinter alumina between 1150° C. and 1500° C. with an optimum of 1450° C.

It is also recommended to progressively increase the pressure in stages, according to a determined profile, and in particular to increase the pressure after the vitreous transition temperature stage because it increases its plasticity. Thus a weak pressure (of approximately 150 bars, for example) is applied at the beginning of the profile to avoid inhomogeneities of densification between the outside and the core of the alumina part. Once the vitreous transition temperature is reached, the temperature is progressively increased in order to cause the ceramic material to flow under optimal densification conditions.

An example of a profile of hot densification under pressure for the HIP technique is given below:
1. Heat gradient of 10° C./min up to approximately 1100° C. Constant pressure of 150 bars.
2. Plateau at 1100° C. for 1 h with a pressure increase from 150 bars to 700 bars.
3. Finalizing the densification at 1450° C. with heat gradient of 10° C./min, with increase to 1000 bars of pressure. Plateau for 3 h.
4. Reducing the pressure to 150 bars at the beginning of the cooling to 1200° C., then maintaining at 2 bars until complete cooling with cooling gradient of 10° C./min.

When the interface layer contains silicon, the later thermodynamically participates at the end of the process of diffusion and formation of the spinel. In fact, silicon has a greater enthalpy of formation energy than magnesium oxide.

The solid parts are prepared (in preforms, for example) according to a desired geometry and so as to be brought into mutual contact, at least along certain surfaces thereof. An application example is the construction of parts having axial symmetry in which one of the parts can slide into the other. The interface layer is then situated between the two facing surfaces.

It should be noted that the step of hot densification under pressure serves both to obtain definitive solid parts made from metal and from alumina, and to permanently and closely link these solid parts to form an indissociable block of these parts. The hot densification under pressure makes it possible to obtain assemblies of parts having complex and varied shapes.

According to an embodiment, the method of the invention can comprise an encapsulation step for bringing into contact parts of insulating and conductive material. Thus, after bringing the parts into contact, and before the hot densification under pressure, the assembly of the parts can be put into a capsule, for example a metal tube. After the hot densification step, the capsule is removed.

According to an embodiment, the method of the invention can also comprise a step of finish-machining of the block obtained following the step of hot densification under pressure. This finishing makes it possible to obtain the sensitive part of the sensor in a suitable shape for the desired application.

FIG. 1 is a diagrammatic representation of a non-limitative embodiment example of a capacitive sensor according to the invention.

The capacitive sensor 10 comprises a measurement electrode 2 extending from the front face 9 of the sensor along its axis of symmetry. The measurement electrode 2 is surrounded by a dielectric element 3. At the back of the sensor 10, the measurement electrode 2 is connected to a cable 6 for transferring a signal measured by the electrode 2 to a system for processing the signal (not shown).

According to the example in FIG. 1, the capacitive sensor is of the axisymmetrical type, according to a coaxial arrangement.

The electrode 2—dielectric element 3 assembly, also called sensitive part of the sensor, is fixed in a body 4 of the sensor, which can be linked with an electrical ground. The fixing can be performed, for example, by bonding of the body 3 on a support element 5 integral with the dielectric element 3. In the embodiment shown, the body 4 of the sensor is made from platinum, or an alloy composed of a majority of platinum.

The sensor 10 thus constituted can be, for example, inserted in a wall of a turbine engine for measuring the passage of the blades, by measurement of the capacitive coupling between these blades and the measurement electrode 2.

In order to produce the sensitive part of the capacitive sensor 10, a method according to the present invention is implemented in order to assemble the electrode 2, the dielectric element 3, and where necessary, the support element 5 as described below.

The conductive and insulating materials are chosen for their intrinsically stable temperature characteristics, the compatibility of their relative thermal expansion characteristics, their stability under the chemical and environmental stresses described above, the bonding capability of the conductive material, the dielectric characteristics intrinsic to the insulating material and the electrical conductivity for the conductive material.

More particularly, the material of the electrode 2, and where necessary, of the support element 5, is selected from the following list: platinum (Pt), tantalum (Ta), or an alloy comprising a majority of one of these materials. In the embodiment shown, the electrode 2, and, where necessary, the support element 5 are made from platinum, or an alloy comprising a majority of platinum.

The material of the dielectric element 3 is alumina.

The elements of the sensitive part of the sensor, including where necessary the support element 5, can be obtained by preforming of the geometric parts ("greens"). Once the shapes have been preformed, the application of an interface layer of material designed to perform the adhesion between the electrode 2 and the dielectric element 3 respectively, and between the dielectric element 3 and the support element 5, is applied. When the parts are assembled, the geometry of the assembly is fixed due to the step of hot densification under pressure.

The indissociable block thus obtained can be finish-machined in order to obtain the sensitive part of the sensor in the final shape desired.

The step of hot densification under pressure and optionally the machining make it possible to construct sensors of various shapes.

The base parts (electrode 2, dielectric element 3, and where necessary the support element 5) can be totally or partially obtained by alternative methods of production such as machining (electrical discharge machining, parting-off), pre-sintering or any other method for producing mechanical parts.

The interface, or adhesion, layer, containing magnesium oxide can be applied by powder deposition or thin layer deposition on any other known means.

According to a non-limitative embodiment, and respecting the experimental and implementation conditions of the method according to the invention described above, the sensitive part of the capacitive sensor according to the invention can be manufactured according to the following steps:
  Cold preforming of alumina powder in order to obtain a "green" of the dielectric element (alumina part),
  Obtaining the electrode and the support element (metal parts) by machining,
  Depositing a layer containing magnesium oxide on the alumina,
  Contacting or assembly of the solid parts,
  Encapsulating the assembly,
  Hot sintering under pressure of the encapsulated assembly in order to obtain an indissociable block,
  Removal of the capsule, and
  Finish-machining of the block in order to obtain the sensitive part of the sensor.

According to another non-limitative example, and respecting the experimental and implementation conditions of the method according to the invention described above, the sensitive part of the capacitive sensor according to the invention can also be manufactured in the following manner:
  Cold preforming of alumina and metal powders in order to obtain a "green" of the ceramic and one or more "greens" of metal,
  Depositing an interface layer containing magnesium oxide on at least one of the facing surfaces of the solid parts,
  Assembling the solid parts,
  Encapsulating (if the HIP technique is used, otherwise it is not necessary),
  Hot sintering under pressure in order to obtain an indissociable block,
  Removing the capsule (if the HIP technique is used, otherwise it is not necessary), and
  Finish-machining of the block in order to obtain the sensitive part of the sensor.

The phase of hot sintering under pressure can comprise a predensification phase of the ceramic by a combined progressive increase of the temperature and the pressure via an intermediate level.

According to yet another non-limitative example, and respecting the experimental and implementation conditions of the method according to the invention described above, the sensitive part of the capacitive sensor according to the invention can also be manufactured in the following manner:
  Cold preforming and sintering of the alumina and metal powders in order to obtain the solid parts (can originate from simple machined supplies),
  Depositing an interface layer containing magnesium oxide on at least one of the facing surfaces of the solid parts,
  Assembling the solid parts,
  Sintering according to the HIP technique, without capsule, in order to obtain an indissociable block, and
  Finish-machining of the block in order to obtain the sensitive part of the sensor.

Such a capacitive sensor can be used, for example, in turbine engines. As a function of firing sequences, temperature cycles are produced, the amplitudes of the temperatures being able to vary from approximately $-40/°$ C. to approximately $1500°$ C., as a function of ambient conditions. The turbine blades passing in front of the capacitive sensor can generate transitory pressures of the order of approximately 40 bars.

Figure 2:
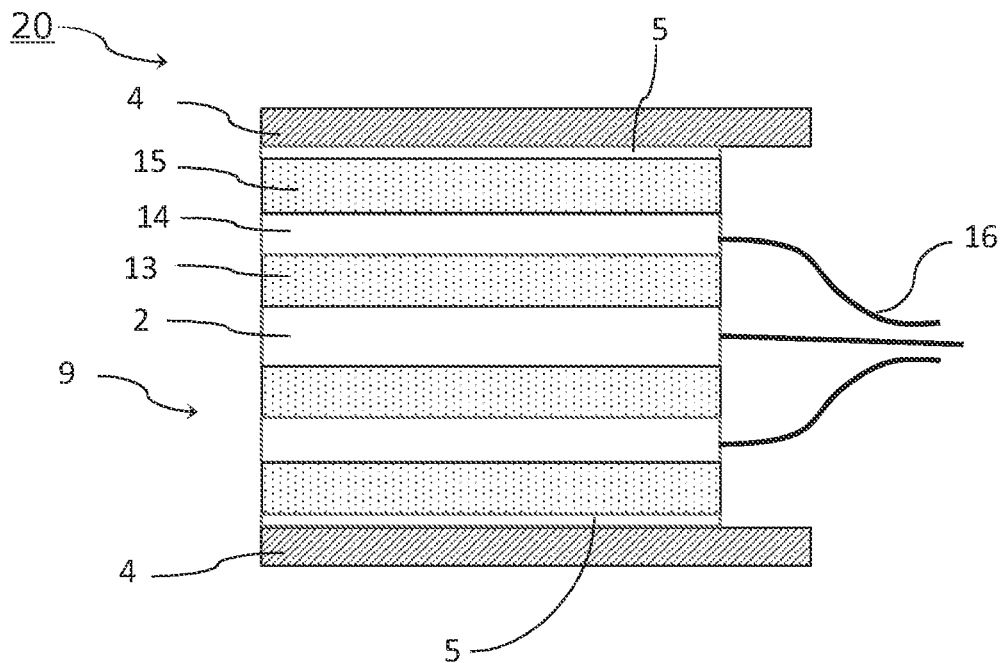
FIG. 2 is a diagrammatic representation of another non-limitative embodiment example of a capacitive sensor a part of which is produced by the method according to the present invention.

FIG. 2 is a diagrammatic representation of another non-limitative embodiment example of a capacitive sensor according to the invention, according to a triaxial structure.

The capacitive sensor 20 comprises a measurement electrode 12 extending from the front face 9 of the sensor along its axis of symmetry. The measurement electrode 2 is surrounded by a first dielectric element 13 that is cylindrical in shape. At the back of the sensor 20, the measurement electrode 2 is connected to a cable 16 for transferring a signal measured by the electrode 2 to a system for processing the signal (not shown).

The capacitive sensor 20 moreover comprises a guard electrode 14 that is cylindrical in shape, arranged around the first dielectric element 13, then a second dielectric element 15 that is cylindrical in shape, arranged around the guard electrode 14.

At the back of the sensor 20, the guard electrode 14 is also connected to the signal transfer cable 16, so as to be polarized at the potential of the electrode 2.

The electrode 2—first dielectric element 13—guard electrode 14—second dielectric element 15 assembly, also called sensitive part of the sensor, is fixed in a body 4 of the sensor, which can be linked with an electrical ground. The fixing can be performed, for example, by bonding on a support element 5 integral with the dielectric element 15. The body 4 of the sensor is, for example, made from platinum, or an alloy comprising a majority of platinum.

In order to produce the sensitive part of the capacitive sensor 20, a method according to the present invention is implemented in order to assemble the measurement electrode 2, the first dielectric element 13, the guard electrode 14, the second dielectric element 15, and where necessary, the support element 5.

In particular, all the embodiment examples of the method according to the invention described for the production of the sensor 10 according to the first embodiment are applicable to the production of the sensor 20 according to the present embodiment.

As for the sensor 10, the material of the electrode 2, the guard electrode 14 and, where necessary, the support element 5, is selected from the following: platinum (Pt), tantalum (Ta), or an alloy comprising a majority of one of these materials. In the embodiment shown, the measurement electrode 2, the guard electrode 14 and, where necessary, the support element 5 are made from platinum, or an alloy comprising a majority of platinum.

The first dielectric element 13 and the second dielectric element 15 are made from alumina.

Of course, the invention is not limited to the examples which have just been described and numerous adjustments can be made to these examples without exceeding the scope of the invention.

The invention claimed is:

1. A method for the assembly of a metal part and a ceramic part, comprising the following steps:
   supplying a solid ceramic part of the alumina type;
   supplying a solid metal part, the metal being selected from platinum and tantalum, or an alloy comprising a majority of one of these metals;
   depositing an interface layer comprising at least one layer on at least one of the solid parts, the interface layer containing magnesium oxide;
   bringing into contact the solid metal part and the solid ceramic part such that the interface layer is located between the solid parts; and
   hot densification under pressure of the solid parts brought into contact, in order to create a close bond between the solid parts and to form a spinel from the interface layer.

2. The method according to claim 1, characterized in that it comprises a step of supplying a solid metal part from an alloy comprising a majority of platinum, and one of the following components: rhodium (Rh), iridium (Ir), aluminium (Al), gold (Au).

3. The method according to claim 1, characterized in that it comprises a step of supplying a solid ceramic part of the alumina type with purity over 99.5%.

4. The method according to claim 1, characterized in that it further comprises the following steps:
   encapsulating the solid metal and solid ceramic parts brought into contact before the step of hot densification under pressure; and
   removing the encapsulation after the step of hot densification under pressure.

5. The method according to claim 1, characterized in that any one of the steps of supplying a solid part comprises one of the following steps:
   preforming powder by cold pressing to form a solid part; or
   machining of a solid part.

6. The method according to claim 5, characterized in that the step of preforming powder is followed by a sintering step.

7. The method according to claim 1, characterized in that the step of hot densification under pressure comprises at least one step of hot sintering under pressure selected from the following sintering techniques:
   heat isostatic pressing;
   spark plasma sintering;
   field assisted sintering; and
   pulsed electric current sintering.

8. The method according to claim 1, characterized in that the step of depositing at least one layer of the interface layer is carried out by the deposition of magnesium oxide powder.

9. The method according to claim 1, characterized in that the step of depositing at least one layer of the interface layer is carried out by the deposition of a thin layer of magnesium and the oxidation of said thin layer of magnesium.

10. The method according to claim 1, characterized in that the thickness of the interface layer is between 1 μm and 50 μm.

11. The method according to claim 1, characterized in that the interface layer is deposited on the solid metal part.

12. The method according to claim 1, characterized in that the interface layer comprises silicon.

13. The method according to claim 12, characterized in that the silicon comprises at least one of the following materials: silicate, silicide.

14. The method according to claim 12, characterized in that the depositing the interface layer comprises a step of depositing a layer of silicon on the solid metal part prior to the deposition of a layer containing magnesium oxide.

15. The method according to claim 14, characterized in that the thickness of the silicon layer is between 10 nm and 500 nm.

16. The method according to claim 1, characterized in that it comprises a step of forming a sensitive part of a capacitive sensor by assembly of the solid metal part forming an electrode and the solid ceramic part forming a dielectric element.

17. An electrical device, comprising:
   at least one conductive metal part, the metal being selected from platinum and tantalum, or an alloy comprising a majority of one of these metals; and
   at least one dielectric ceramic element of the alumina type;
   the at least one conductive metal part and the at least one dielectric ceramic element being assembled according to claim 1.

18. The electrical device according to claim 17, in the form of a capacitive sensor suitable for being used at temperatures over 800° C., comprising:
   a conductive metal part forming a measurement electrode; and
   at least one said dielectric ceramic element surrounding said measurement electrode.

* * * * *